United States Patent
Wu et al.

(10) Patent No.: US 11,239,285 B2
(45) Date of Patent: Feb. 1, 2022

(54) ORGANIC ELECTROLUMINESCENT DISPLAY PANEL, DISPLAY DEVICE, AND DETECTION METHOD

(71) Applicants: Chongqing BOE Display Technology Co., Ltd., Chongqing (CN); BOE Technology Group Co., Ltd., Beijing (CN)

(72) Inventors: Xinwei Wu, Beijing (CN); Zhen Zhang, Beijing (CN); Wei Zhang, Beijing (CN); Cunzhi Li, Beijing (CN); Jonguk Kwak, Beijing (CN); Yanyan Xu, Beijing (CN)

(73) Assignees: Chongqing BOE Display Technology Co., Ltd., Beibei (CN); BOE Technology Group Co., Ltd., Beijing (CN)

( * ) Notice: Subject to any disclaimer, the term of this patent is extended or adjusted under 35 U.S.C. 154(b) by 23 days.

(21) Appl. No.: 16/920,825

(22) Filed: Jul. 6, 2020

(65) Prior Publication Data
US 2021/0028250 A1    Jan. 28, 2021

(30) Foreign Application Priority Data
Jul. 22, 2019  (CN) .......................... 201910661113.9

(51) Int. Cl.
*H01L 27/32*    (2006.01)
*H01L 51/00*    (2006.01)
*H01L 51/56*    (2006.01)

(52) U.S. Cl.
CPC ...... *H01L 27/3223* (2013.01); *H01L 27/3276* (2013.01); *H01L 51/0031* (2013.01); *H01L 51/0096* (2013.01); *H01L 51/56* (2013.01)

(58) Field of Classification Search
CPC ....................... H01L 27/3223; H01L 27/3276
See application file for complete search history.

(56) References Cited

U.S. PATENT DOCUMENTS 9,874,907 B2    1/2018  Wang
2018/0033835 A1   2/2018  Zeng et al.
(Continued)

FOREIGN PATENT DOCUMENTS

CN    104571460 A    4/2015
CN    105226070 A    1/2016
(Continued)

OTHER PUBLICATIONS

Chinese Office Action for corresponding application 201810803180.5 dated Dec. 3, 2020.

*Primary Examiner* — Douglas M Menz
(74) *Attorney, Agent, or Firm* — Arent Fox LLP; Michael Fainberg (57) ABSTRACT

Embodiments of the present disclosure provide an organic electroluminescent display panel, a display device, and a detection method. For the organic electroluminescent display panel, the light-emitting control lines include two first light-emitting control lines electrically connected to the two light-emitting control circuits; and each first light-emitting control line includes: a surrounding portion surrounding the hole area, and a connecting portion electrically connecting two ends of the surrounding portion to the two light-emitting control circuits, the connecting portion is electrically connected by a control component at a position of being connected to one light-emitting control circuit, and the control component is configured to disconnect the light-emitting control circuit from the connecting portion when defect detection is performed, to determine a cracking state of the hole area according to a light-emitting state of pixels (Continued)

driven by the connecting portion between the control component and the hole area.

20 Claims, 7 Drawing Sheets

(56) References Cited

U.S. PATENT DOCUMENTS

| | | | |
|---|---|---|---|
| 2020/0168140 A1 | 5/2020 | Chen et al. | |
| 2021/0097936 A1* | 4/2021 | Ge | G09G 3/3258 |
| 2021/0217379 A1* | 7/2021 | Li | G06F 3/042 |

FOREIGN PATENT DOCUMENTS

| | | | |
|---|---|---|---|
| CN | 106935144 A | 7/2017 | |
| CN | 106972046 A | 7/2017 | |
| CN | 107230698 A | 10/2017 | |
| CN | 107295333 A | 10/2017 | |
| CN | 109031823 A | 12/2018 | |
| CN | 109491134 A | 3/2019 | |
| CN | 109559687 A | 4/2019 | |
| CN | 109713024 A | 5/2019 | |
| CN | 109961729 A | 7/2019 | |
| CN | 109979366 A | 7/2019 | |
| KR | 20170001331 A | 1/2017 | |

* cited by examiner

ORGANIC ELECTROLUMINESCENT DISPLAY PANEL, DISPLAY DEVICE, AND DETECTION METHOD

CROSS-REFERENCE TO RELATED APPLICATION

This application claims priority of Chinese Patent Application No. 201910661113.9, filed on Jul. 22, 2019, which is hereby incorporated by reference in its entirety.

FIELD

The present disclosure relates to the field of display technologies, and in particular to an organic electroluminescent display panel, a display device, and a detection method.

BACKGROUND

Organic light-emitting diodes (Organic Light-Emitting Diode, OLED) have become a very competitive and promising next-generation display technology due to a series of advantages such as all-solid structure, high brightness, full viewing angle, fast response, and flexible display.

SUMMARY

Embodiments of the present disclosure provide an organic electroluminescent display panel, including a display area and a non-display area surrounding the display area, where the display area has a hole area;

the non-display area includes two light-emitting control circuits, and the two light-emitting control circuits are respectively located on two sides of the display area;

the display area includes a plurality of light-emitting control lines, and the light-emitting control lines include a first light-emitting control line electrically connected to the two light-emitting control circuits; and the first light-emitting control line comprises: a surrounding portion surrounding the hole area, and a connecting portion respectively electrically connecting both ends of the surrounding portion to the two light-emitting control circuits, wherein the connecting portion is electrically connected one light-emitting control circuit through by a control component, and the control component is configured to disconnect the light-emitting control circuit from the connecting portion when defect detection is performed, to determine a cracking state of the hole area according to a light-emitting state of pixels driven by the connecting portion between the control component and the hole area.

In some embodiments, the organic electroluminescent display panel includes: two first light-emitting control lines and two control components; and the two first light-emitting control lines are respectively located on two sides of the hole area, and the surrounding portions of the two first light-emitting control lines are semi-circular, and respectively surround opposite sides of the hole area.

In some embodiments, one control component is located on a side of the hole area facing one light-emitting control circuit, and the other control component is located on a side of the hole area facing the other light-emitting control circuit.

In some embodiments, the organic electroluminescent display panel further includes: two leads, and two hole test pads located in the non-display area; and one end of at least one of the leads is electrically connected to one of the control components, and other end of at least one of the leads is electrically connected to one of the hole test pads.

In some embodiments, the control component is a switch transistor; and a gate of the switch transistor is electrically connected to one of the leads, a first terminal of the switch transistor is electrically connected to the connecting portion, and a second terminal of the switch transistor is electrically connected to the light-emitting control circuit.

In some embodiments, one side of the non-display area further includes a panel test pad; and the hole test pad and the panel test pad are located on a same side of the non-display area.

In some embodiments, the light-emitting control lines further include: a plurality of second light-emitting control lines, and the plurality of second light-emitting control lines are located on one side of the hole area between the two first light-emitting control lines, and are electrically connected to one light-emitting control circuit; and the light-emitting control lines further comprise a plurality of third light-emitting control lines, the plurality of third light-emitting control lines are located on other side of the hole area between the two first light-emitting control lines, and are electrically connected to other one of light-emitting control circuits.

In some embodiments, the light-emitting control lines further include: a plurality of fourth light-emitting control lines; and one end of at least one of the fourth light-emitting control lines is electrically connected to one of the light-emitting control circuits, and other end of at least one of the fourth light-emitting control lines is electrically connected to other one of the light-emitting control circuits.

In some embodiments, a material of the first light-emitting control line is molybdenum.

In some embodiments, the organic electroluminescent display panel further includes: a plurality of data lines and power lines; and a material of the data line and the power line includes aluminum.

Embodiments of the present disclosure further provide a display device, including the organic electroluminescent display panel provided by the embodiments of the present disclosure.

An embodiment of the present disclosure provides a detection method for detecting the organic electroluminescent display panel according to the embodiments of the present disclosure, and the detection method includes:

applying a first preset voltage to the control component, and disconnecting, by the control component, the connecting portion from the light-emitting control circuit; and determining there is no crack in the hole area in response to that pixels driven by the connecting portion between the control component and the hole area emit light; and determining there is a crack in the hole area in response to that pixels driven by the connecting portion between the control component and the hole area do not emit light.

In some embodiments, the detection method further includes:

applying a second preset voltage to the control component, and connecting, by the control component, the connecting portion to the light-emitting control circuit so as to perform a light-on detection.

DETAILED DESCRIPTION OF THE EMBODIMENTS

Figure 1:
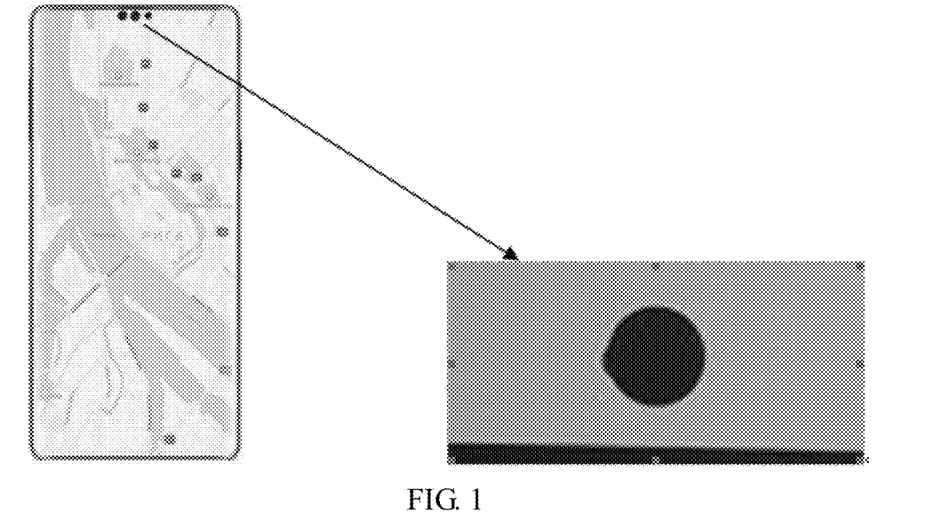
FIG. 1 illustrates a full-screen display mobile phone, a left part thereof is a schematic diagram of a full-screen display mobile phone, and a right part thereof is a schematic diagram of a design of a hole in a display area.
Figure 2:
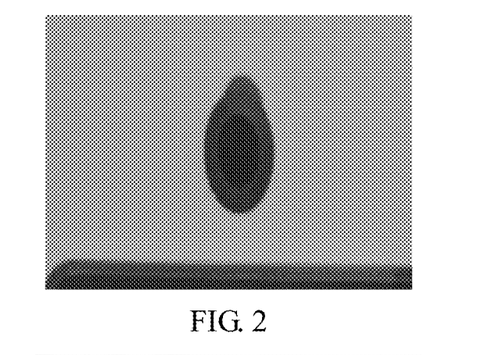
FIG. 2 is a schematic diagram of a hole area with an encapsulation failure.
Figure 3:
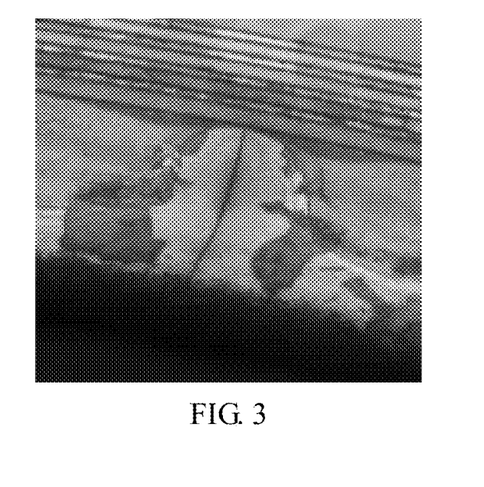
FIG. 3 is a schematic diagram of performing enlargement on a crack position.
Figure 4:
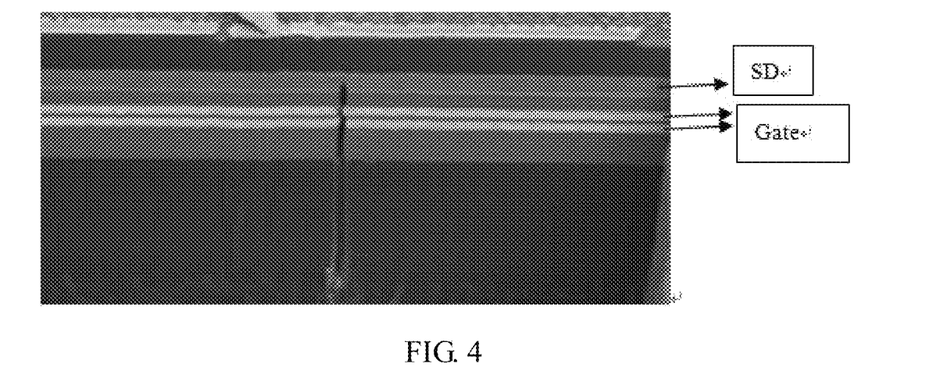
FIG. 4 is another schematic diagram of performing enlargement on a crack position.

With reference to FIG. 1-FIG. 4, the left part of FIG. 1 is a schematic diagram of a full-screen display mobile phone, the right part of FIG. 1 is a schematic diagram of performing enlargement on a hole position in a display area, FIG. 2 is a schematic diagram when a encapsulation failure occurs in a hole area, FIG. 3 is a schematic diagram of performing enlargement on a crack position, and FIG. 4 is another schematic diagram of performing enlargement at a crack position. That is, for a screen of a mobile phone, most manufacturers are pursuing a higher screen-to-body ratio, hoping to bring more dazzling visual impact to customers, but a camera and some sensors hinder the development of a screen with a higher screen-to-body ratio. Putting the camera and some sensors in the screen is currently having high attention in the industry. To implement higher transmittance, designing a hole in a display area is attracting the attention of the majority of screen manufacturers. For flexible active-matrix organic light-emitting diodes (AMOLED), when the hole is designed in the display area, effectiveness of encapsulation faces a huge challenge. An inorganic layer is very likely to crack when encountering external force collision, and then water and oxygen invade the display area along a crack produced by cracking. As a result, a failure of a luminescent material is caused, and this further leads to poor display. This failure of the luminescent material is a progressive defect, which is difficult to find in the early stage. Consequently, a lot of human resources are wasted.

The implementation process of the embodiments of the present disclosure is described in detail below with reference to the accompanying drawings of the description. It should be noted that the same or similar reference numerals indicate the same or similar elements or elements with the same or similar functions throughout. The embodiments described below with reference to the drawings are exemplary, and are only used to explain the present disclosure, and cannot be construed as limiting the present disclosure.

Figure 5:
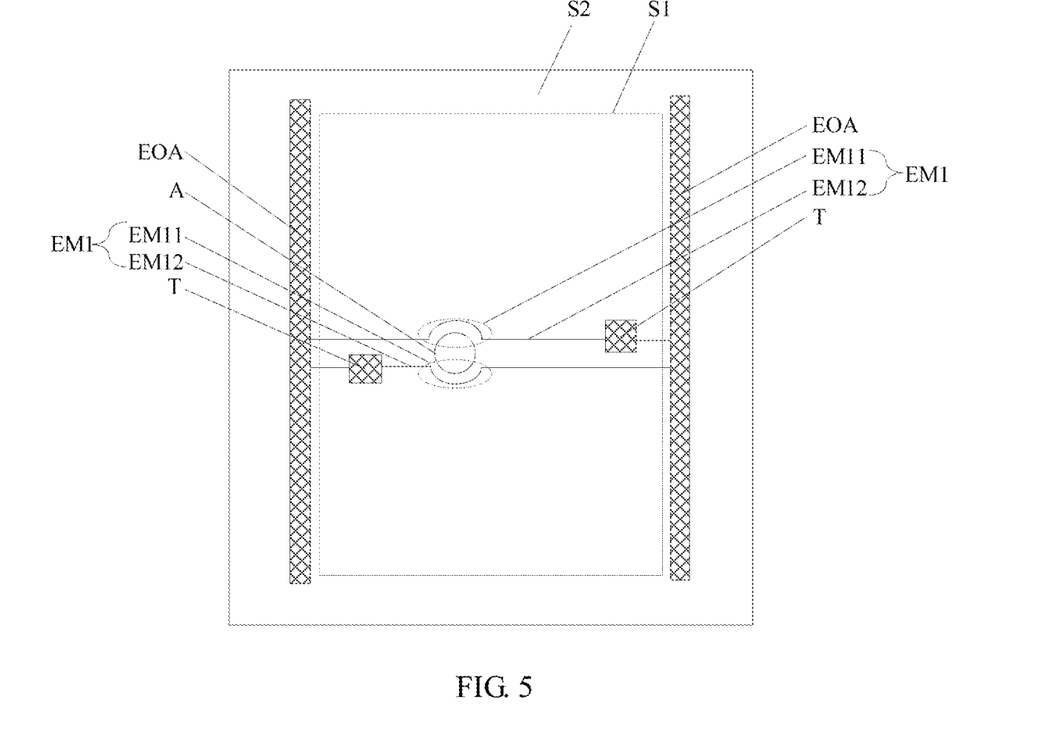
FIG. 5 is a schematic structural diagram of an organic display panel according to an embodiment of the present disclosure.

Referring to FIG. 5, an embodiment of the present disclosure provides an organic electroluminescent display panel, including a display area S1, and a non-display area S2 surrounding the display area S1. The display area S1 has a hole area A.

The non-display area S2 includes two light-emitting control circuits EOA, and the two light-emitting control circuits EOA are respectively located on both sides of the display area S1. As shown in FIG. 5, one light-emitting control circuit EOA is located on the left side of the display area S1, and the other light-emitting control circuit EOA is located on the right side of the display area S1.

The display area S1 includes a plurality of light-emitting control lines. The light-emitting control lines include a first light-emitting control line EM1 electrically connected to the two light-emitting control circuits.

The first light-emitting control line EM1 includes a surrounding portion EM11 surrounding the hole area A, and a connecting portion EM12 that electrically connects both ends of the surrounding portion EM11 to the two light-emitting control circuits EOA. The connecting portion EM12 is electrically connected by a control component T at a position of being connected to one light-emitting control circuit EOA, and the control component T is configured to disconnect the light-emitting control circuit EOA from the connecting portion EM12 when defect detection is performed, to determine a cracking state of the hole area A according to a light-emitting state of pixels driven by the connecting portion EM12 between the control component T and the hole area A.

In the organic electroluminescent display panel provided by embodiments of the present disclosure, because an inorganic film layer of a hole area A is likely to crack, a first light-emitting control line EM1 adjacent to the hole area A is arranged around the hole area, and a control component T is provided on the first light-emitting control line EM1. Further, when the film layer of the hole area A is cracked, no signal is outputted to part of a connecting portion EM12 between the control component T and the hole area A by disabling the control component T. Therefore, pixels driven by the part of the connecting portion EM12 cannot emit light, and dark lines appear at this position. In this way, whether cracking of the film layer occurs near the hole area A or not can be detected, and a defective display product can be detected as soon as possible, to avoid the defective display product. If an encapsulation failure cannot be detected in time, a waste of a lot of human resources is caused.

It should be noted that, because the display panel of the present disclosure is an organic light-emitting display panel, the light-emitting layer is an organic film layer, the inorganic film layer in the hole area A is likely to crack when encountering an external force, and external water vapor may gradually invade the organic film layer along a crack produced by cracking of the inorganic film layer, and finally the display effect is affected. However, because the process of external water vapor invading the organic film layer belongs to a progressive defect, and is a slow and long process, consequences cannot be immediately found at an early stage of forming the crack. Further, when a cracked and damaged display product is subjected to the subsequent process, a waste of human resources or damage to the product reputation is caused. For example, when the display product that cracking occurs in the hole area A is sold to a user, the user may have a bad user experience, and all kinds of human and financial resources in the process of outputting the display product to the user are also wasted. Further, in the organic light-emitting display panel provided by the present disclosure, whether the hole area A is cracked or not can be detected in an indirect way by detecting whether the first light-emitting control line is cracked, and the display product with the crack in the hole area A can be detected in advance.

Optionally, the light-emitting control line of embodiments of the present disclosure may be a signal line that controls on duration of a thin film transistor of a pixel circuit, to further implement light-emitting duration of a light-emitting diode of the pixel circuit. In the present disclosure, the light-emitting control line is selected for detection. On one hand, a material of the light-emitting control line is generally molybdenum. Compared with a power line and a data line that include aluminum, when an inorganic film layer adjacent to the light-emitting control line made of molybdenum is cracked, the light-emitting control line is also likely to crack correspondingly. However, the material of aluminum is not likely to crack due to good toughness. Therefore, the light-emitting control line of molybdenum is more suitable as a detection line. On the other hand, when the light-emitting control line is loaded with signals, it is in an on state for more than 99% of the time, and most of the time, it is in a state of loading signals. The probability of signal transitions is small, so that the impact of loading (Loading) is minimal. Therefore, the light-emitting control line is more suitable to defect detection. In addition, for the control component T in the embodiment of the present disclosure, for example, as shown in FIG. 5, the first light-emitting control line EM1 above the hole area A is electrically connected to the light-emitting control circuit EOA on the left side by the control component T, and the control component T is located on the side closer to the light-emitting control circuit EOA. That is, a distance of the control component T to the light-emitting control circuit EOA is less than a distance of the control component T to the hole area A. That is, if a defect occurs in the hole area A, the connecting portion EM12 between the hole area A and the light-emitting control circuit EOA is almost unable to load a signal. That is, the pixels on the connecting portion EM12 cannot emit light, further poor display can be performed by a relatively long dark line defect, and an effect of defect detection is more obvious.

Optionally, the light-emitting control circuit EOA in embodiments of the present disclosure may be a structural component that provides a signal for the light-emitting control line. In addition, in some embodiments, if the hole area A is circular, the surrounding portion EM11 of the first light-emitting control line EM1 in embodiments of the present disclosure may be arc-shaped, and is provided around the periphery of the hole area A. The connecting portion EM12 may be a linear shape extending in a first direction. For example, the first direction may be the lateral direction in FIG. 5.

In some embodiments, as shown in FIG. 5, the organic electroluminescent display panel includes: two first light-emitting control lines EM1 and two control components T. The two first light-emitting control lines EM1 are respectively located on both sides of the hole area A, and the two surrounding portions EM11 of the two first light-emitting control lines EM1 are both semi-circular, and respectively surround opposite sides of the hole area A. In some embodiments of the present disclosure, there are two first light-emitting control signal lines EM1, and the two control lines EM1 are respectively located on the upper and lower sides of the hole area A, and may almost completely surround the hole area A. In this way, detection of cracking of a thin layer may be implemented at most locations of the hole area A.

In some embodiments, one control component T is located on a side of the hole area A facing one light-emitting control circuit EOA, and the other control component T is located on a side of the hole area A facing the other light-emitting control circuit EOA. In this embodiment of the present disclosure, the two control components T of the two first light-emitting control lines EM1 are respectively located on different sides of the hole area A, so that it can be avoided that a placement position of the control components T is small when the two control components are disposed on the same side of the hole area A.

Figure 6:
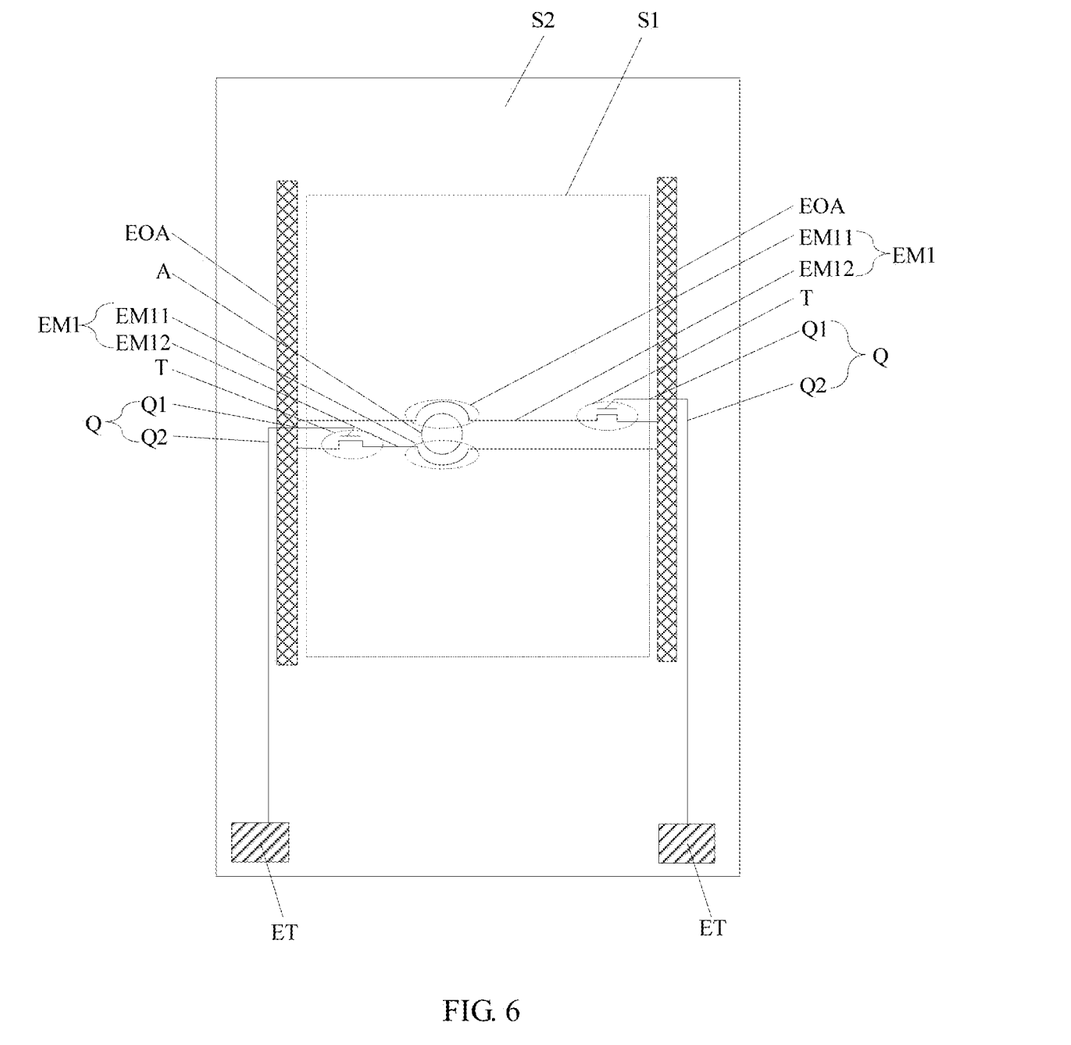
FIG. 6 is a schematic structural diagram of an organic display panel provided with leads according to an embodiment of the present disclosure.

In some embodiments, as shown in FIG. 6, the organic electroluminescent display panel further includes: two leads Q, and two hole test pads ET located in the non-display area S2. One end of each lead Q is electrically connected to one control component T, the other end is electrically connected to one hole test pad ET. The leads Q may include a first sub-lead Q1 and a second sub-lead Q2 vertically extending in the non-display area S2. A part of the first sub-lead Q1 extends laterally in the display area S1. Some embodiments of the present disclosure further include a lead Q and a hole test pad ET, so that individual control to the control component can be implemented.

In some embodiments, referring to FIG. 6, the control component T is a switch transistor. A gate of the switch transistor is electrically connected to the lead Q, a first terminal of the switch transistor is electrically connected to the connecting portion EM12, and a second terminal of the switch transistor is electrically connected to the light-emitting control circuit EOA.

Figure 7:
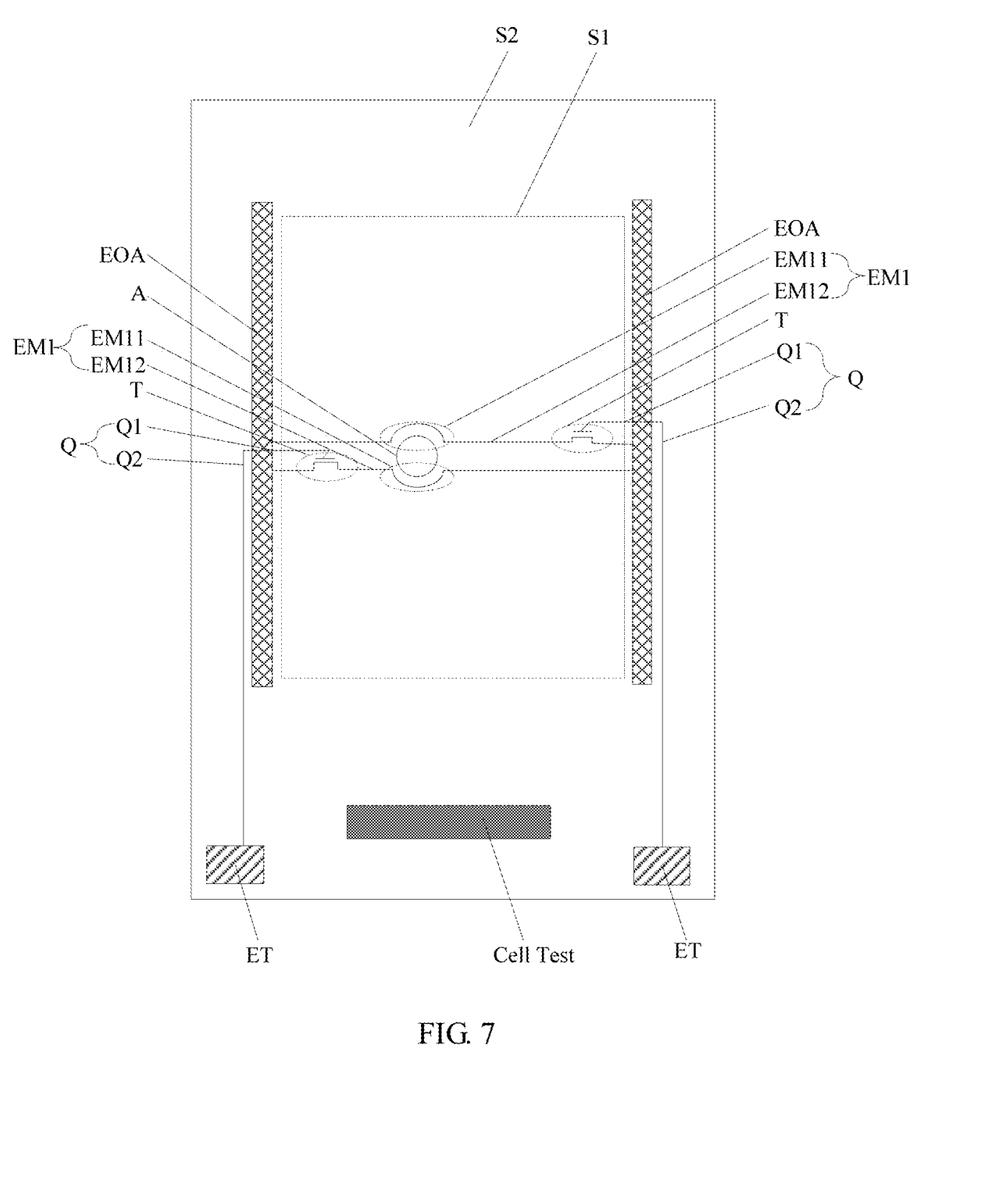
FIG. 7 is a schematic structural diagram of an organic display panel provided with a panel test pad according to an embodiment of the present disclosure.

In some embodiments, as shown in FIG. 7, one side of the non-display area S2 further includes a panel test pad Cell Test. The hole test pad ET and the panel test pad Cell Test are located on the same side of the non-display area S2. For example, as shown in FIG. 7, the panel test pad Cell Test is located on a bottom area of the display panel, and the hole test pad ET is located on the bottom area of the display panel, so that manufacturing is convenient, and detection can be performed with convenience at a close position together with other detections.

Figure 8:
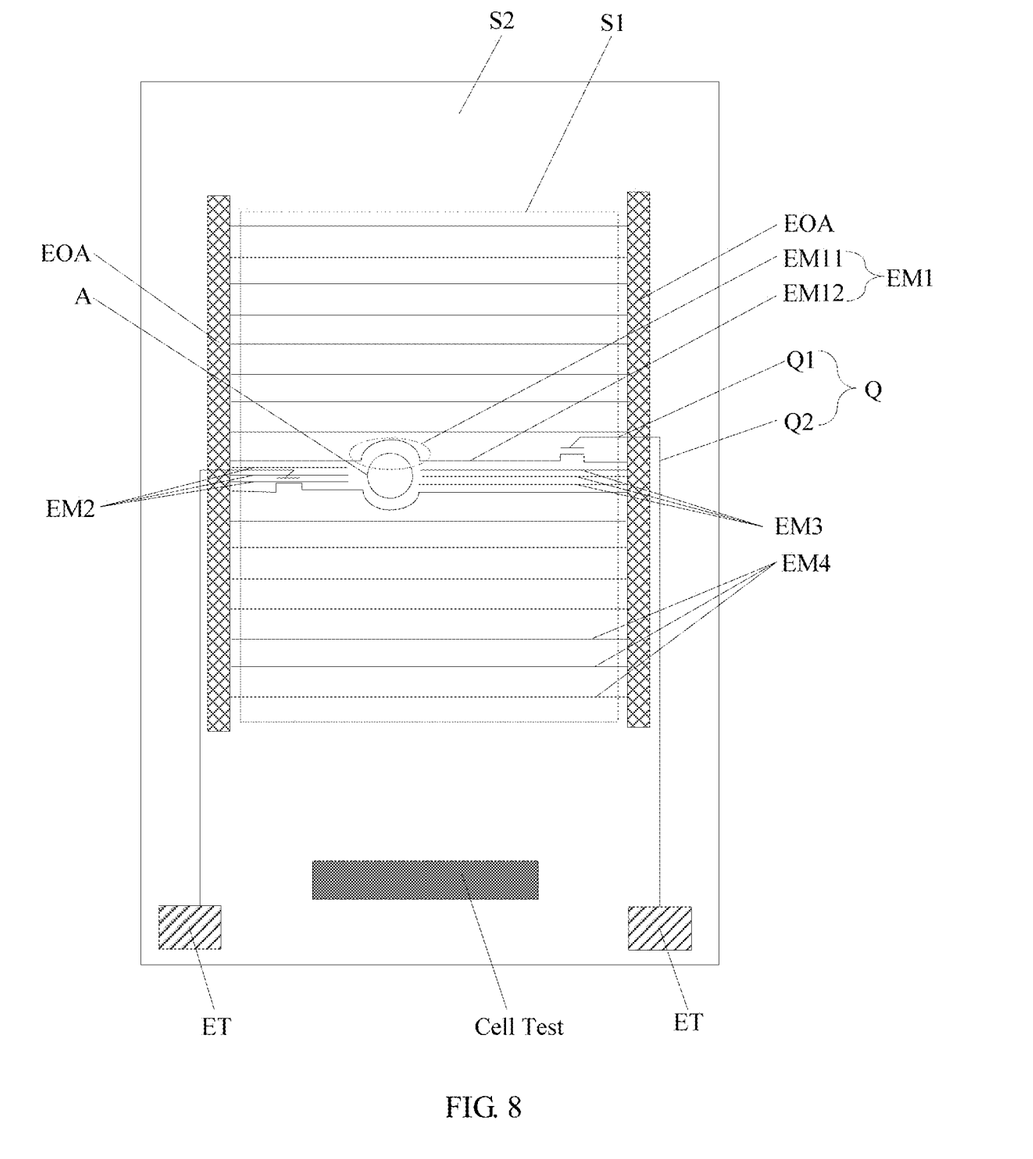
FIG. 8 is a schematic structural diagram of an organic display panel provided with a second light-emitting control line, a third light-emitting control line, and a fourth light-emitting control line according to an embodiment of the present disclosure.

In some embodiments, referring to FIG. 8, the light-emitting control lines further include: a plurality of second light-emitting control lines EM2, and the plurality of second light-emitting control lines EM2 are located on one side of the hole area A between the two first light-emitting control lines EM1, and are electrically connected to only one light-emitting control circuit EOA. The light-emitting control lines further include: a plurality of third light-emitting control lines EM3, and the plurality of third light-emitting control lines EM3 are located the other side of the hole area A between the two first light-emitting control lines EM1, and are electrically connected to only the other light-emitting control circuit EOA. For example, as shown in FIG. 8, a plurality of second light-emitting control lines EM2 located on the left side of the hole area A are further included between the two first light-emitting control lines EM1, and the plurality of second light-emitting control lines EM2 are electrically connected to only the light-emitting control circuit EOA on the left side of the display panel, that is, only single-side driving is performed by the light-emitting control circuit EOA on the left side. A plurality of third light-emitting control lines EM3 located on the right side of the hole area A are included between the two first light-emitting control lines EM1, and the plurality of third light-emitting control lines EM3 are electrically connected to only the light-emitting control circuit EOA on the right side of the display panel, that is, single-side driving is performed by only the light-emitting control circuit EOA on the right side. In this way, a problem that pixels on the left and right sides of the hole area A cannot be driven due to blocking of the hole area A can be avoided.

In some embodiments, referring to FIG. 8, the light-emitting control lines further include: a plurality of fourth light-emitting control lines EM4, one end of each fourth light-emitting control line EM4 is electrically connected to one light-emitting control circuit EOA, and the other end is electrically connected to the other light-emitting control circuit EOA. For example, as shown in FIG. 8, the fourth light-emitting control lines EM4 all extend in a lateral direction, both ends are electrically connected to the light-emitting control circuits EOA at two sides, and double-side driving is performed.

Figure 9:
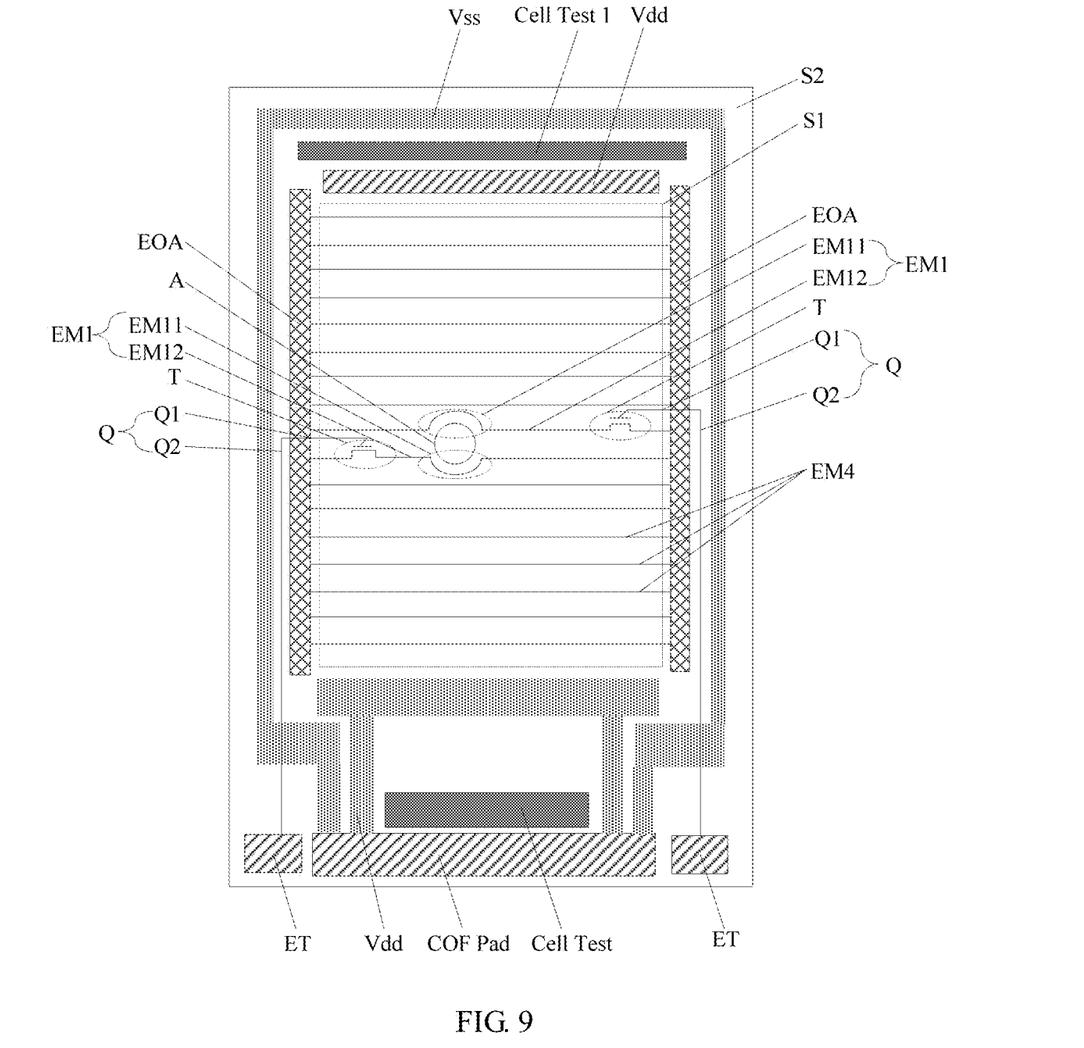
FIG. 9 is a schematic structural diagram of a specific organic display panel according to an embodiment of the present disclosure.

In some embodiments, as shown in FIG. 9, the organic light-emitting display panel may further include: a flexible printed circuit board test pad COF Pad located on the same side of the non-display area as the panel test pad Cell Test, and a first power line Vdd, a second power line Vss, and a panel test pad Cell Tset1 on the opposite side are located in the non-display area S2.

In some embodiments, a material of the first light-emitting control line is molybdenum.

In some embodiments, the organic electroluminescent display panel further includes: a plurality of data lines and power lines, and a material of the data line and power line includes aluminum.

Based on a same inventive concept, an embodiment of the present disclosure further provides a display device, including the organic electroluminescent display panel provided by embodiments of the present disclosure.

Figure 10:
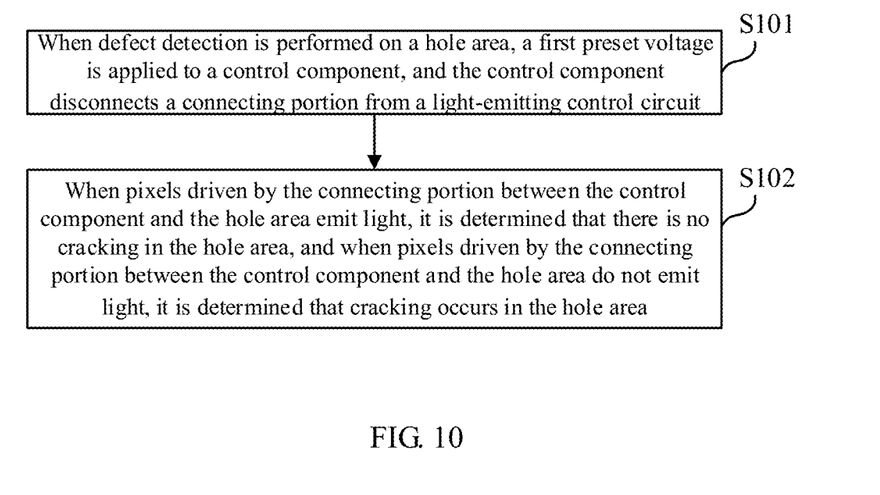
FIG. 10 is a schematic flowchart of a driving method of an organic display panel according to an embodiment of the present disclosure.

Based on a same inventive concept, an embodiment of the present disclosure provides a detection method for detecting the organic electroluminescent display panel provided by embodiments of the present disclosure. As shown in FIG. 10, the detection method includes the following steps.

Step S101: When defect detection is performed on a hole area, a first preset voltage is applied to a control component, and the control component disconnects a connecting portion from a light-emitting control circuit.

Step S102: When pixels driven by the connecting portion between the control component and the hole area emit light, it is determined that there is no cracking in the hole area, and when pixels driven by the connecting portion between the control component and the hole area do not emit light, it is determined that cracking occurs in the hole area.

In some embodiments of the present disclosure, the control component is a switch transistor. A voltage that enables the switch transistor to be off is applied to the switch transistor, and signal inputting may be performed for the first light-emitting control line by only the light-emitting control circuit on the other side where the control component is not provided. Because the connecting portion between the hole area and the light-emitting control circuit that the control component is not provided may load signals by the light-emitting control circuit, and whether the connecting portion between the hole area and the control component can load signals or not depends on whether cracking occurs in the hole area or not. Further, if no cracking occurs in the hole area, the connecting portion between the hole area and the control component may receive signals applied by the light-emitting control circuit on the side where the switch control component is not provided, and may further drive pixels on the part of the connecting portion to emit light. If cracking occurs in the hole area, the connecting portion between the hole area and the control component cannot receive signals inputted by the light-emitting control circuit on the side where the switch control component is not provided, and may not drive pixels on the part of the connecting portion to emit light. Further, during detection, if the control component is disabled, and when a dark line is observed, it means that cracking occurs in the hole area, and if there is no dark line, it means that no cracking occurs in the hole area. That is, the organic light-emitting display panel shown in FIG. 9 is used as an example, during normal lighting, a constant DC voltage of −7V is supplied to the hole test pad ET to ensure that the two control components (that is, switch transistors TFT) are on. Two first light-emitting control lines EM1 are driven on both sides, other second light-emitting control lines EM2 and third light-emitting control lines EM3 near the hole area are driven on one side. Because an on-state ratio of the light-emitting control line is greater than 99%, signal line loading of the first light-emitting control line EM1 is small, and no display difference is produced herein. When the hole area is detected, a constant DC voltage of 7V is provided to the hole test pad ET to ensure that the two TFTs are off. In this case, if a crack occurs near the hole area, and the upper or lower sides of the two first light-emitting control lines EM1 are cracked, signals are inputted to only one side of the two first light-emitting control lines EM1, and no signal is written on the other sides. Therefore, bad dark lines are shown in a macro manner and the hole crack can be detected.

In some embodiments, the detection method further includes the following step.

A second preset voltage is applied to the control component, and the control component connects the connecting portion to the light-emitting control circuit so as to perform a light-on detection. The control component is on, the control circuit on the side where the control component is provided may input signals to the connecting portion, and then other aspects of detection may be performed.

Beneficial effects of the embodiments of the present disclosure are as follows: In the organic electroluminescent display panel provided by the embodiments of the present disclosure, light-emitting control lines include first light-emitting control lines electrically connected to two light-emitting control circuits. Each first light-emitting control line includes: a surrounding portion surrounding a hole area and a connecting portion electrically connecting two ends of the surrounding portion to the two light-emitting control circuits. The connecting portion is electrically connected by a control component at a position of being connected to one light-emitting control circuit, the control component is configured to disconnect the light-emitting control circuit from the connecting portion when defect detection is performed, to determine a cracking state of the hole area according to a light-emitting state of pixels driven by the connecting portion between the control component and the hole area. That is, in the organic light-emitting display panel provided by the embodiment of the present disclosure, the first light-emitting control line adjacent to the hole area is arranged around the hole area, and the switch control component is provided on the first light-emitting control line; further, no signal is inputted to the part of the connecting portion between the control component and the hole area by disabling the control component when a film layer on the hole area is cracked. Therefore, pixels driven by the part of the connecting portion cannot emit light, and this makes a dark line appear at this position. In this way, whether cracking of a film layer occurs near the hole area or not can be detected, and a defective display product can be detected as soon as possible, to avoid the defective display product. If an encapsulation failure cannot be detected in time, a waste of a lot of human resources is caused.

Obviously, a person skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

The invention claimed is:

1. An organic electroluminescent display panel, comprising a display area and a non-display area surrounding the display area, the display area comprises a hole area; wherein,
the non-display area comprises two light-emitting control circuits, and the two light-emitting control circuits are respectively located on two sides of the display area;
the display area comprises a plurality of light-emitting control lines, and the light-emitting control lines comprise a first light-emitting control line electrically connected to the two light-emitting control circuits; and
the first light-emitting control line comprises: a surrounding portion surrounding the hole area, and a connecting portion respectively electrically connecting both ends of the surrounding portion to the two light-emitting control circuits, wherein the connecting portion is electrically connected one light-emitting control circuit through by a control component, and the control component is configured to disconnect the light-emitting control circuit from the connecting portion when defect detection is performed, to determine a cracking state of the hole area according to a light-emitting state of pixels driven by the connecting portion between the control component and the hole area.

2. The organic electroluminescent display panel according to claim 1, further comprising two first light-emitting control lines and two control components; wherein,
the two first light-emitting control lines are respectively located on two sides of the hole area, and the surrounding portions of the two first light-emitting control lines are semi-circular, and respectively surround opposite sides of the hole area.

3. The organic electroluminescent display panel according to claim 2, wherein one control component is located on a side of the hole area facing one light-emitting control circuit, and the other control component is located on a side of the hole area facing the other light-emitting control circuit.

4. The organic electroluminescent display panel according to claim 2, further comprising two leads, and two hole test pads located in the non-display area; wherein,
one end of at least one of the leads is electrically connected to one of the control components, and other end of at least one of the leads is electrically connected to one of the hole test pads.

5. The organic electroluminescent display panel according to claim 4, wherein the control component is a switch transistor; and
a gate of the switch transistor is electrically connected to one of the leads, a first terminal of the switch transistor is electrically connected to the connecting portion, and a second terminal of the switch transistor is electrically connected to the light-emitting control circuit.

6. The organic electroluminescent display panel according to claim 4, wherein one side of the non-display area further comprises a panel test pad; and
the hole test pad and the panel test pad are located on a same side of the non-display area.

7. The organic electroluminescent display panel according to claim 2, wherein the light-emitting control lines further comprise a plurality of second light-emitting control lines, and the plurality of the second light-emitting control lines are located on one side of the hole area between the two first light-emitting control lines, and are electrically connected to one of the light-emitting control circuits; and
the light-emitting control lines further comprise a plurality of third light-emitting control lines, the plurality of third light-emitting control lines are located on other side of the hole area between the two first light-emitting control lines, and are electrically connected to other one of light-emitting control circuits.

8. The organic electroluminescent display panel according to claim 7, wherein the light-emitting control lines further comprise a plurality of fourth light-emitting control lines; and
one end of at least one of the fourth light-emitting control lines is electrically connected to one of the light-emitting control circuits, and other end of at least one of the fourth light-emitting control lines is electrically connected to other one of the light-emitting control circuits.

9. The organic electroluminescent display panel according to claim 1, wherein a material of the first light-emitting control line is molybdenum.

10. The organic electroluminescent display panel according to claim 9, further comprising: a plurality of data lines and power lines; wherein
a material of the data line and the power line comprises aluminum.

11. A display device, comprising the organic electroluminescent display panel according to claim 1.

12. The display device according to claim 11, further comprising two first light-emitting control lines and two control components; wherein,
the two first light-emitting control lines are respectively located on two sides of the hole area, and the surrounding portions of the two first light-emitting control lines are semi-circular, and respectively surround opposite sides of the hole area.

13. The display device according to claim 12, wherein one control component is located on a side of the hole area facing one light-emitting control circuit, and the other control component is located on a side of the hole area facing the other light-emitting control circuit.

14. The display device according to claim 12, wherein the organic electroluminescent display panel further comprising two leads, and two hole test pads located in the non-display area; wherein,
one end of at least one of the leads is electrically connected to one of the control components, and other end of at least one of the leads is electrically connected to one of the hole test pads.

15. The display device according to claim 14, wherein the control component is a switch transistor; and
a gate of the switch transistor is electrically connected to one of the leads, a first terminal of the switch transistor is electrically connected to the connecting portion, and a second terminal of the switch transistor is electrically connected to the light-emitting control circuit.

16. The display device according to claim 14, wherein one side of the non-display area further comprises a panel test pad; and the hole test pad and the panel test pad are located on a same side of the non-display area.

17. The display device according to claim 12, wherein the light-emitting control lines further comprise a plurality of second light-emitting control lines, and the plurality of the second light-emitting control lines are located on one side of the hole area between the two first light-emitting control lines, and are electrically connected to one of the light-emitting control circuits; and the light-emitting control lines further comprise a plurality of third light-emitting control lines, the plurality of third light-emitting control lines are located on other side of the hole area between the two first light-emitting control lines, and are electrically connected to other one of light-emitting control circuits.

18. The display device according to claim 17, wherein the light-emitting control lines further comprise a plurality of fourth light-emitting control lines; and one end of at least one of the fourth light-emitting control lines is electrically connected to one of the light-emitting control circuits, and other end of at least one of the fourth light-emitting control lines is electrically connected to other one of the light-emitting control circuits.

19. A detection method for detecting the organic electroluminescent display panel according to claim 1, comprising:

applying a first preset voltage to the control component, and disconnecting, by the control component, the connecting portion from the light-emitting control circuit; and determining there is no crack in the hole area in response to that pixels driven by the connecting portion between the control component and the hole area emit light; and determining there is a crack in the hole area in response to that pixels driven by the connecting portion between the control component and the hole area do not emit light.

20. The detection method according to claim 19, further comprising:

applying a second preset voltage to the control component, and connecting, by the control component, the connecting portion to the light-emitting control circuit so as to perform a light-on detection.

* * * * *